United States Patent
Naidu et al.

(10) Patent No.: US 12,021,374 B2
(45) Date of Patent: Jun. 25, 2024

(54) METHOD AND DEVICE FOR FAULT LOCATION IN A MULTI-TERMINAL TRANSMISSION SYSTEM

(71) Applicant: Hitachi Energy Ltd, Zürich (CH)

(72) Inventors: Obbalareddi Demudu Naidu, Bangalore (IN); Neethu George, Bangalore (IN); Swaroop Gajare, Bangalore (IN)

(73) Assignee: HITACHI ENERGY LTD, Zurich (CH)

( * ) Notice: Subject to any disclaimer, the term of this patent is extended or adjusted under 35 U.S.C. 154(b) by 239 days.

(21) Appl. No.: 17/044,188

(22) PCT Filed: Mar. 29, 2019

(86) PCT No.: PCT/IB2019/052605
§ 371 (c)(1),
(2) Date: Sep. 30, 2020

(87) PCT Pub. No.: WO2019/186490
PCT Pub. Date: Oct. 3, 2019

(65) Prior Publication Data
US 2021/0143633 A1 May 13, 2021

(30) Foreign Application Priority Data
Mar. 31, 2018 (IN) .............. 201841012259

(51) Int. Cl.
*H02H 7/26* (2006.01)
*G01R 31/08* (2020.01)
*H02H 7/28* (2006.01)

(52) U.S. Cl.
CPC ........... *H02H 7/263* (2013.01); *G01R 31/086* (2013.01); *G01R 31/088* (2013.01); *H02H 7/28* (2013.01)

(58) Field of Classification Search
CPC ........ H02H 7/263; H02H 7/28; G01R 31/086; G01R 31/088
See application file for complete search history.

(56) References Cited

U.S. PATENT DOCUMENTS 4,455,612 A * 6/1984 Girgis .................. H02H 3/40
702/69
4,795,983 A * 1/1989 Crockett ................ G01R 31/52
361/76

(Continued)

FOREIGN PATENT DOCUMENTS

CN 101356444 A 1/2009
CN 101779134 A 7/2010

(Continued)

OTHER PUBLICATIONS

Sukumar Brahma, "Fault location scheme for a multi-terminal transmission line using synchronized voltage measurements",2005, IEEE Transactions On Power Delivery, vol. 20, No. 2, pp. 1325-1331 (Year: 2005).*

(Continued)

*Primary Examiner* — Alexander Satanovsky
*Assistant Examiner* — Sharah Zaab
(74) *Attorney, Agent, or Firm* — Slater Matsil, LLP (57) ABSTRACT

A method of protection can be used in response to a fault in a multi-terminal power transmission system that includes a first transmission line section connecting a first terminal to a transmission line junction, a second transmission line section connecting a second terminal to the transmission line junction and a third transmission line section connecting a third terminal to the transmission line junction. The fault being located in one of the first, second or third transmission line sections. The section having the fault can be determined based on a number of calculations and other factors and a (Continued)

switching device can be controlled according to the identification of the section having the fault.

22 Claims, 4 Drawing Sheets

(56) References Cited

U.S. PATENT DOCUMENTS

| | | | |
|---|---|---|---|
| 5,485,394 A | 1/1996 | Murata et al. | |
| 5,825,189 A * | 10/1998 | Johns | G01R 31/085 702/59 |
| 6,256,592 B1 | 7/2001 | Roberts et al. | |
| 7,286,963 B2 | 10/2007 | Saha et al. | |
| 7,472,026 B2 | 12/2008 | Premerlani et al. | |
| 8,183,871 B2 | 5/2012 | Saha et al. | |
| 2007/0156358 A1 | 7/2007 | Saha et al. | |
| 2009/0150099 A1 | 6/2009 | Balcerek et al. | |
| 2011/0037480 A1 | 2/2011 | Balcerek et al. | |
| 2011/0178741 A1 * | 7/2011 | Saha | G01R 31/085 702/59 |
| 2013/0141827 A1 * | 6/2013 | Ukil | H02H 3/38 361/85 |
| 2015/0073735 A1 | 3/2015 | Abido et al. | |

FOREIGN PATENT DOCUMENTS

| | | | | |
|---|---|---|---|---|
| CN | 101907677 A | | 12/2010 | |
| CN | 103809082 A | | 5/2014 | |
| EP | 0358488 A2 | | 3/1990 | |
| EP | 0464662 A1 | | 6/1991 | |
| GB | 2462001 | * | 1/2010 | G01R 31/08 |
| IN | WO2017072612 | * | 4/2017 | G01R 31/08 |
| JP | H0219779 A | | 1/1990 | |
| WO | 2017072612 A1 | | 5/2017 | |

OTHER PUBLICATIONS

Anees, Ahmed Sharique, et al., "Fault Location Scheme on a Three Phase Transmission Line using Synchronized Phasor Measurement", 2012 IEEE 5th India International Conference on Power Electronics (IICPE), Dec. 6-8, 2012, 6 pages.

Brahma, Sukumar M., et al., "New Fault-Location Method for a Single Multiterminal Transmission Line Using Synchronized Phasor Measurements", IEEE Transactions on Power Delivery, vol. 21, No. 3, Jul. 2006, pp. 1148-1153.

Girgis, Adly A., et al., "A New Fault Location Technique for Two- and Three-Terminal Lines", Transactions on Power Delivery, vol. 7, No. 1, Jan. 1992, 10 pages.

Jena, Premalata, et al., "A Positive-Sequence Directional Relaying Algorithm for Series-Compensated Line", IEEE Transactions on Power Delivery, vol. 25, No. 4, Oct. 2010, pp. 2288-2298.

* cited by examiner

METHOD AND DEVICE FOR FAULT LOCATION IN A MULTI-TERMINAL TRANSMISSION SYSTEM

CROSS-REFERENCE TO RELATED APPLICATIONS

This application is a national stage application of International Application No. PCT/IB2019/052605, filed on Mar. 29, 2019, which application claims priority to India Patent Application No. 201841012259, filed on Mar. 31, 2018, which applications are hereby incorporated herein by reference.

TECHNICAL FIELD

The present disclosure relates in general to fault localization in power transmission systems. More specifically, the present invention relates to fault localization in a multi-terminal transmission system using only current measurements.

BACKGROUND

Multi-terminal power transmission lines are used to integrate renewable power, or to supply power, to bulk industrial loads. Multi-terminal or tapped mixed lines provide a feasible solution to provide power at minimum cost. Multi-terminal mixed or tapped lines are transmission lines comprising of both overhead lines (OHL) and cables that are usually underground (UGC), that are connected at one or more taps or junctions. Using multi-terminal/tapped mixed lines saves the costs associated with building substation and installing measurement transformers at tap/junction points. There has been a huge growth in the number of multi-terminal/tapped lines mainly due to increased renewable integration to the grid.

Auto-reclosing is vital for the reliability of power system. Introducing tap in a main overhead line (OHL) and connected underground cable (UGC) complicates the auto-reclosing philosophy. To define the auto-reclosing of a multi-terminal mixed line, fault section identification information is required. In general, when the fault is in an OHL, auto-reclosing is permitted for two or three times as most of the faults in OHL are transient faults. On the other hand, for fault in cables, auto-reclosing is not permitted because majority of the cable faults are rather of a permanent nature. The case becomes more challenging in case of multi-terminal mixed lines where the auto reclosing is to be enabled only for a fault in an overhead line and blocked for a fault in a cable.

In order to accurately identify whether the fault is in an overhead line or in a cable, typically voltage and current measurements are required. This adds an overhead in case of multi-terminal lines as there are three or more terminals and measurement equipment are to be provided for each terminal and tap/junction points. These power systems may or may not have both voltage and current measurements at each terminal. Especially, there may not be measurement equipment at each tap/junction point.

There is accordingly a need for determining the fault section with limited measurements at various locations of the multi-terminal power transmission system, in order to accurately enable auto-reclosing in such systems.

Accurate fault location in such transmission lines is equally important for maintenance crew to reach the fault point and undertake repair quickly. Quick identification of fault location improves the reliability, availability and save the revenue loss for the utilities.

In case of multi-terminal lines, numerous methods are employed to identify fault location. Known techniques for determining fault location typically rely on both voltage and current measurements, negative sequence quantities and knowledge of fault type or fault loop information. In multi-terminal mixed lines, such measurements or knowledge of fault type or fault loop may not be available. Also, methods based on specific fault type or fault loop information, or specific measurements may not work for all fault cases, or power system configurations.

Thus, in addition to determining the fault section with limited measurements, it is desired to have accurate fault location with limited measurements and fault information.

SUMMARY

Various aspects of the present invention relate to protection in response to a fault or fault protection in a multi-terminal power transmission system (power transmission system). In accordance with various embodiments, the power transmission system includes one or more overheard lines and one or more cables, wherein two or more transmission lines are connected at one or more tap or junctions. In other words, the power transmission system is a mixed or hybrid transmission system having a combination of overhead lines and cables. Further, the transmission system can have single or double circuit lines connecting different power systems.

The power transmission system connects three or more terminals, with at least a first terminal, a second terminal and a third terminal. Here the three or more terminals are connected by two or more transmission lines, with at least a first transmission line and a second transmission line. The two or more transmission lines are connected at one or more tap or junction points. For instance, the first and second transmission lines are connected at a junction. Thus, various line sections (sections) are formed between terminals and taps/junctions. In case of a three terminal system having three terminals connected by two transmission lines at a junction, there are three sections—a first section between the first terminal and the junction, a second section between the second terminal and the junction, and a third section between the third terminal and the junction. Also, at least one of the two transmission lines is an overhead line and the other a cable. Accordingly, one or more sections are overhead line sections or cables.

The present invention discloses a method for protection in response to a fault (or disturbance) in the multi-terminal power transmission system. The fault (or disturbance) can be in a section of the one or more sections of the power transmission system. Such a fault can happen due to a temporary disturbance (e.g. due to bad weather conditions), due to insulation failure and so forth. The method determines which section of the power transmission system has the fault, using only current measurements, to correctly perform auto-reclosing operations. The method can also determine the location of the fault (i.e. distance from a terminal) on the section.

The method is performed with an Intelligent Electronic Device (IED) associated with the power transmission system. For example, the method can be implemented with an IED associated with a terminal such as one of the first, second and third terminals of the system.

The method includes obtaining pre-fault and during-fault measurements of currents for each terminal of the power transmission system. The current measurements can be obtained using measurement equipment such as current transformers, sensor-based measurement equipment (e.g. Rogowski coils, non-conventional instrument transformers etc.) and the like, which provide a signal corresponding to currents as sensed from the line. The IED receives the signal from the measurement equipment and processes the same to obtain the pre-fault and during-fault current measurements. Alternately, another power system device such as a disturbance recorder can process the current signals and provide the same to the IED.

The method further includes calculating pre-fault and during-fault values of positive sequence current phasors from the pre-fault and during-fault measurements of currents for each terminal. The IED can calculate current phasors (e.g. using suitable phasor calculation such as Fourier calculations etc.), from the current measurements. Positive sequence quantities can be derived by using methods such as symmetrical component analysis etc.

In addition, the method includes calculating at least two values of a fault section index for each section. For example, two values for a fault section index can be calculated for one section. For calculating the value for a section, the following are utilized:

an assumed value for fault location;
a difference between the pre-fault and the during-fault values of the positive sequence current phasors for two terminals;
a length of the section;
source impedances of the two terminals; and
line parameters of the corresponding section.

The assumed value for the fault location can be a value of '0', in case the fault location is assumed to be on the beginning of the section, '1' in case the fault location is assumed to be at the end of the section. Thus one value can be calculated for '0' and another value can be calculated for '1', where 1 corresponds the length of the section.

In some embodiments, several values for fault location are assumed. This can be starting from '0' and incremented in small amounts (e.g. 0.1). Here, identifying the section having the fault includes calculating a location of the fault by calculating a plurality of values for the fault section index based on the plurality of assumed values for the fault location.

The difference between the pre-fault and during-fault positive sequence current phasors is calculated for the phasors of two terminals. The terminals include the terminal of the section, and one other terminal. Consider a system having terminals A, B and C, and sections AJ, BJ and CJ, where AJ is the section between terminal A and junction J, BJ is the section between terminal B and J, and CJ is the section between terminal C and J. Here, for section AJ, the phasors for terminal A and that of terminal B or C are used.

The assumed value, the difference between the current phasors, are used with source impedances of the two terminals and line parameters of the corresponding section. For example, for section AJ, fault section index ($K_{A0}$, $K_{A1}$) can be calculated as follows:

$$K_{A0} = \left|\frac{I_B^1 - I_B^{1,pre}}{I_A^1 - I_A^{1,pre}}\right| - \left|\frac{Q1}{T1}\right|$$

$$K_{A1} = \left|\frac{I_B^1 - I_B^{1,pre}}{I_A^1 - I_A^{1,pre}}\right| - \left|\frac{P1}{S1}\right|$$

Here, $K_{A0}$ is with assumed value of '0' for the fault location, and is for an assumed value of '1' for the fault location. The difference between pre-fault and during-fault positive sequence current phasors of terminal B is $I_B^1 - I_B^{1,pre}$ and terminal A is $I_A^1 - I_A^{1,pre}$. Further, P1, Q1, S1 and T1 are calculated using the source impedances and line parameters as follows:

$$P1 = A_{BJ}Z_{JB}^0 + B_{BJ}Z_{JJ}^0$$

$$Q1 = A_{BJ}Z_{BB}^0 + B_{BJ}Z_{BJ}^0$$

$$S1 = A_{AJ}Z_{JA}^0 + B_{AJ}Z_{JJ}^0$$

$$T1 = A_{AJ}Z_{BA}^0 + B_{AJ}Z_{BJ}^0$$

The ABCD parameters and source impedances can be used for calculating P1, Q1, S1 and T1:

$$A_{AJ} = \frac{Z_{JJ}^{mod}}{Z_{AJ}^{mod^2} - Z_{JJ}^{mod}Z_{AA}^{mod}}$$

$$B_{AJ} = \frac{-Z_{AJ}^{mod}}{Z_{AJ}^{mod^2} - Z_{JJ}^{mod}Z_{AA}^{mod}}$$

$$A_{BJ} = \frac{1}{Z_{C_{BJ}}}\tanh(\gamma_{BJ}L_{BJ} * 0.5) + \frac{1}{Z_{C_{BJ}*sinh(\gamma_{BJ}L_{BJ})}}$$

$$B_{BJ} = \frac{-1}{Z_{C_{BJ}*sinh(\gamma_{BJ}L_{BJ})}}$$

In the above, $Z_{mn}^{mod}$ the corresponding element of the modified bus impedance matrix after simply removing the elements corresponding to the faulted section AJ $Z_{ij}^0$ is the corresponding element of the original bus impedance matrix $Zc_{BJ}$ is the surge impedance of line BJ, $\gamma_{BJ}$ and $L_{BJ}$ are respectively propagation constant and lengths if the line BJ $ZC_{AJ}$ is the surge impedance of line AJ, $\gamma_{AJ}$ and $L_{AJ}$ are respectively propagation constant and lengths if the line AJ The values calculated for the fault section index for each section are used for identifying the section having the fault. The section having the fault is identified based on a comparison of the values of the fault section index estimated for each section. For example, values of $K_{A0}$, and $K_{A1}$ are compared for section AJ, similarly values computed for section BJ are compared, and so forth. A criteria can be used for identifying the section with the fault. For example, when the two values (in case two values are computed) are of different signs (opposite polarity), then the corresponding section is determined to have the fault.

In the embodiments where several values for the fault section index are calculated, the plurality of values for the fault section index are compared with a threshold. The value which is closest to the threshold (e.g. less than or equal to the threshold) is considered to determine the fault location. The fault location corresponds the assumed value of the fault location, where the value for the fault section index is less than the threshold. Thus, this assumed value of fault location is selected as the fault location.

The identity of the fault section (i.e. it being an overhead line section or a cable) is used for controlling a switching device according to the identification. Here, auto-reclose is enabled based on the section being an overhead line section.

Thus, the IED at a terminal can receive the various current measurements and perform the various steps of the method to determine the faulted section (section having the fault). The IED has an interface for receiving the signals from the measurement equipment, and measurements from other IEDs (e.g. through wired/wireless communication). The IED has a processor configured to perform various steps involved in determining the faulted section. The processor can also performs steps in relation to determining the location of the fault on the section. The processor performs these steps based on information received on the interface and that stored on a memory of the IED. For instance the source impedances and line parameters can be stored in the memory and utilized with the pre-fault and during-fault information, to arrive at the faulted section or fault location.

In an embodiment, the method also includes calculating the source impedances for each terminal. Here, the source impedance for each terminal is calculated based on status of one or more circuit breakers connected at the terminal. The status of the circuit breakers is determined from a communication signal (e.g. a GOOSE communication). An admittance value of a circuit element connected through each circuit breaker is considered based on the status of the circuit breaker. For example, when the breaker is connected, the admittance value of the circuit element is considered. Otherwise, it is not considered. In accordance with the embodiment, the processor also calculates the values of the source impedances for each terminal. These are based on the status signals received at the interfaces.

DETAILED DESCRIPTION

Various aspects of the present invention relate to protection in response to a fault or fault protection in a multi-terminal power transmission system (power transmission system). This is a mixed/tapped power transmission system.

Figure 1:
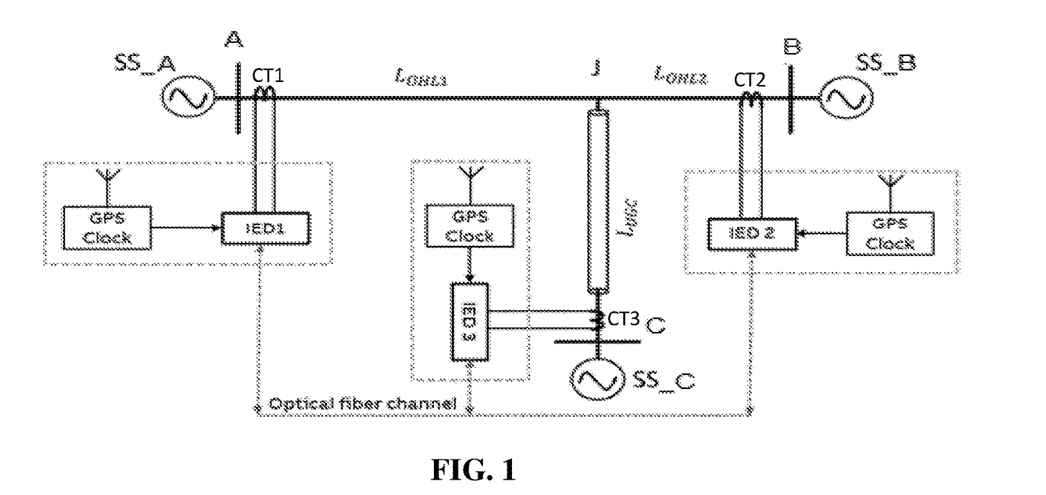
FIG. 1 shows a three terminal tapped power transmission system, in accordance with an embodiment of the invention.

An example of such a mixed/tapped power transmission is shown in FIG. 1. The transmission system shown in FIG. 1 is a three-terminal/tapped power transmission system. Bus A, Bus B and Bus C are the three terminals and J is the junction. Section AJ is an overhead line section of length $L_{OHL1}$ km (or $L_{AJ}$), section BJ is an overhead line section of length $L_{OHL2}$ km (or $L_{BJ}$) and section CJ is a cable (underground) of length $L_{UGC}$ km (or $L_{CJ}$). The power transmission system shown in FIG. 1 will be relied on for explaining the method and device of the present invention. The invention however is not limited to the three-terminal system as shown in FIG. 1 and can be extended to other systems such as power systems having four or more terminals and single/double circuit lines, by making appropriate adaptations to the method/device for such systems.

The present invention discloses a method for protection in response to a fault (or disturbance) in case of such power transmission systems. The fault (or disturbance) can be in a section of the one or more sections of the power transmission system. For example, the fault can be on AJ, BJ or CJ. Such a fault can happen due to a temporary disturbance (e.g. due to bad weather conditions), due to insulation failure and so forth.

The method determines which section (AJ, BJ or CJ) of the power transmission system has the fault, using only current measurements, to correctly perform auto-reclosing operations. The method can also determine the location of the fault (i.e. distance from a terminal) on the section. In order to determine the faulted section and the fault location, synchronized current measurements for all terminals before the fault (pre-fault) and during the fault (as and when the fault is detected) are required.

The method is performed with an Intelligent Electronic Device (IED) associated with the power transmission system. For example, the method can be implemented with IED1 associated with terminal A or IED2 associated with terminal B. Each IED as shown in FIG. 1 has measurements for all terminals. For example, IED1 receives the current signals from current transformer (CT1) shown in FIG. 1 and obtains the current measurements for Bus A from the signals. Further, IED1 is in communication with other IEDS (IED2 and IED3) through a communication channel such as a fiber optic channel shown in FIG. 1. Thus, IED1 also has measurements for other terminals via communication from IED2 and IED3. The three (or more) IEDs of the power transmission system are synchronized with each other. This can be by synchronizing the clocks of these IEDs. Thus, the current measurements at all terminals are synchronized with each other.

Figure 2:
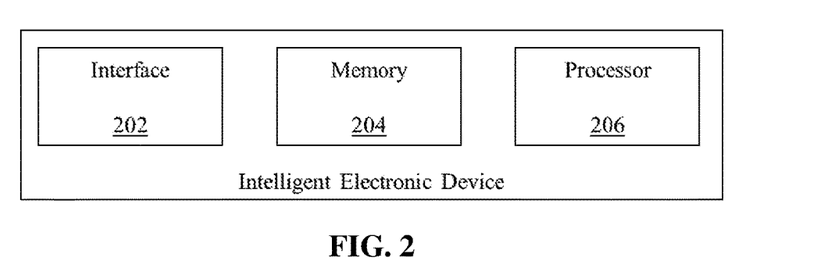
FIG. 2 is a simplified block diagram of an intelligent electronic device, in accordance with various embodiments of the invention.

An IED such as IED1 has an interface (202), a memory (204) and a processor (206), among other components, as shown in the simplified representation of an IED in FIG. 2.

The interface (202) receives signals from the measurement equipment, for example from CT1 in case of IED1. There could be separate I/O for receiving the current signals and communication signals from other IEDs. Each IED in accordance with the invention has one or more interfaces to receive/transmit signals. The memory (204) stores various information necessary to perform the method of the present invention. These can include measurements, source impedances, line parameters including line lengths, impedances etc. These can also include instructions that executable by the processor (206) to perform the steps of the method disclosed herein. The information in the memory can be uploaded to the IED, or calculated and stored during runtime. The processor (206) performs various steps of the method based on the information received via the interface using the information present in the memory.

The following describes the method of the invention, various steps of which are implemented using the IED (such as IED1, IED2 etc.) described hereinabove. The method will be described considering the example power transmission system shown in FIG. 1. Also, $ABCD_{AJ}$ shall denote the positive sequence line impedance parameters (ABCD matrix) of section AJ. $ABCD_{BJ}$ denotes positive sequence line impedance parameters of section BJ. $ABCD_{CJ}$ denotes positive sequence line impedance parameters of section CJ. Let us consider the fault at section AJ. In order to perform the method, source impedances for the terminals are required. The actual source impedances can be used. Alternately, the source impedances can be calculated from breaker status and line impedance data.

Figure 3:
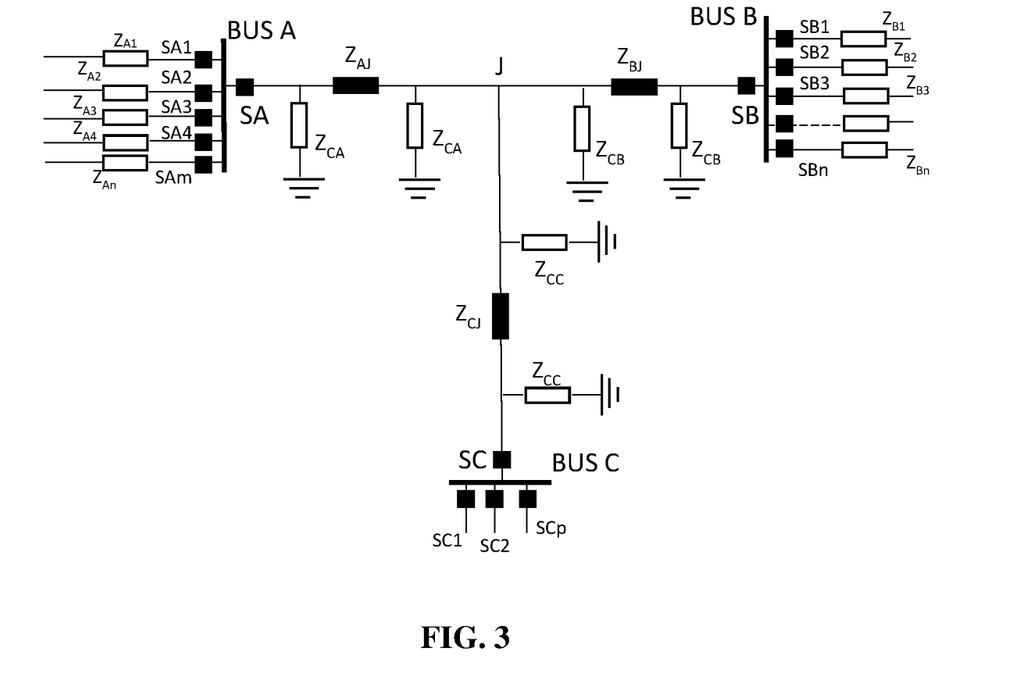
FIG. 3 shows the three terminal system of FIG. 1 along with rest of the transmission network connected at the three buses.

Considering the representation of the three terminal system as shown in FIG. 3, the bus admittance matrix of the equivalent network can be written as below:

$$Y_{BUS} = \begin{bmatrix} y_{aa} & y_{aj} & y_{ab} & y_{ac} \\ y_{ja} & y_{jj} & y_{jb} & y_{jc} \\ y_{ba} & y_{bj} & y_{bb} & y_{bc} \\ y_{ca} & y_{cj} & y_{cb} & y_{cc} \end{bmatrix} \quad (1)$$

The diagonal elements $y_{aa}$, $y_{jj}$, $y_{bb}$ and $y_{cc}$ are calculated as the sum of all the admittances connected to the respective buses. For example, $y_{aa}$ is the sum of all the admittances connected to bus A. This shall depend on the status of the circuit breakers at the bus which can be received using a communication such as a GOOSE/GSSE or wired communication, namely SA1, SA2 ... to SAn. If the breakers are closed, the corresponding impedances are connected to the bus A and thus has to be included in the calculation of element yaa. The series line impedance and shunt admittance of section AJ which are also connected to bus A through closed breaker SA are also included in the calculation of $y_{aa}$.

In the calculations, the source impedance behind any bus is considered to be the equivalent of the impedances connected to the bus. This can be the impedances of the lines connected to the bus or the impedance of the transformer. In case of transformers, the transformer impedance is sufficient; and the LV voltage equivalent is not required.

For example, if all the breakers at bus A are closed, the element $y_{aa}$ can be calculated as, $$y_{aa} = \frac{1}{Z_{A1}} + \frac{1}{Z_{A2}} + \frac{1}{Z_{A3}} + \frac{1}{Z_{A4}} \cdots \frac{1}{Z_{Am}} + \frac{1}{Z_{AJ}} + \frac{1}{Z_{CA}} \quad (2)$$

If any of the breakers, for example, breaker SA3 is opened, then the term $$\frac{1}{Z_{A3}}$$

shall be removed from equation (2). Also, if any additional compensation devices are added to the system, the details shall be acquired and the corresponding impedance term can be added to the admittance calculation in equation (2). For example, if a series compensation device is added behind SA1 with may be 50% compensation, then correspondingly 0.5 times the effective impedance of the device can be incorporated to equation (2).

Similarly, yjj, ybb and ycc can be calculated as below in equations (3), (4) and (5)

$$y_{jj} = \frac{1}{Z_{CA}} + \frac{1}{Z_{CB}} + \frac{1}{Z_{CC}} + \frac{1}{Z_{AJ}} + \frac{1}{Z_{BJ}} + \frac{1}{Z_{CJ}} \quad (3)$$

$$y_{bb} = \frac{1}{Z_{B1}} + \frac{1}{Z_{B2}} + \frac{1}{Z_{B3}} + \frac{1}{Z_{B4}} \cdots \frac{1}{Z_{Bn}} + \frac{1}{Z_{BJ}} + \frac{1}{Z_{CB}} \quad (4)$$

$$y_{cc} = \frac{1}{Z_{C1}} + \frac{1}{Z_{C2}} + \frac{1}{Z_{C3}} + \frac{1}{Z_{C4}} \cdots \frac{1}{Z_{Cp}} + \frac{1}{Z_{CJ}} + \frac{1}{Z_{CC}} \quad (5)$$

Thus, the method utilizes the source impedances either that are uploaded beforehand to the IED, or by calculating the source impedances as described above.

The method involves calculating pre-fault and during-fault positive sequence current phasors at all terminals by suitable phasor estimation method. Current measurements are available from the IEDs, disturbance recorders or other such devices, at all the three terminals. Pre-fault and post fault positive sequence current phasors are calculated from these using any suitable phasor estimation method.

For the three terminal system, pre-fault and post fault positive sequence currents at terminal A are denoted by $I_A^{1,pre}$ and $I_A^1$ respectively, pre-fault and post fault positive sequence currents at terminal B is denoted by $I_B^{1,pre}$ and $I_B^1$ respectively, and pre-fault and post fault positive sequence currents at terminal C is denoted by $I_C^{1,pre}$ and $I_C^1$ respectively.

In order to determine the fault section and fault location, values for fault section index K are calculated using source impedances, line parameters, and the current phasors. The following describes how the fault section index is arrived at.

Initially, fault component of positive sequence current at any bus corresponding to any one healthy section is calculated. Assuming fault on section AJ, this step involves calculation of $(I_B^1 - I_B^{1,pre})$ or $(I_C^1 - I_C^{1,pre})$ as a function of impedances and unknown fault section identification (d).

Considering the positive-sequence pure-fault network, the post-fault voltage at bus B of the system can be expressed as $$V_B^1 = V_B^{1,pre} - Z_{BF}^{new}(d) * I_F \quad (6)$$

where, $V_B^1$ and $V_B^{1,pre}$ are post-fault and pre-fault voltages at terminal B respectively, $I_F$ is the fault current through the fault resistance, and $Z_{BF}^{new}$ is the BF element of the new bus-impedance matrix which includes the fault bus F, and is calculated as below:

$$Z_{BF}^{new}(d) = \frac{\left(Z_{AB}^0/\sinh(\gamma_{AJ} * L_{AJ} * d)\right) + \left(Z_{BJ}^0/\sinh(\gamma_{AJ} * L_{AB} * (1-d))\right)}{\left(1/\sinh(\gamma_{AJ} * L_{AJ} * d)\right) + \left(1/\sinh(\gamma_{AJ} * L_{AJ} * (1-d))\right) + \tanh(\gamma_{AJ} * L_{AJ} * d * 0.5) + \tanh(\gamma_{AJ} * L_{AJ} * (1-d) * 0.5)} \quad (7)$$

In equation (7), $Z_{AB}^0$ and $Z_{JB}^0$ are the corresponding elements of the original bus impedance matrix (either available in the IED or calculated as described above), $\gamma_{AJ}$ and $L_{AJ}$ are propagation constant and length of faulted section respectively, and $I_F$ is the fault current.

Equation (6), along with (7), expresses post-fault bus voltage $V_B^1$ as a function of fault location d.

Figure 4:
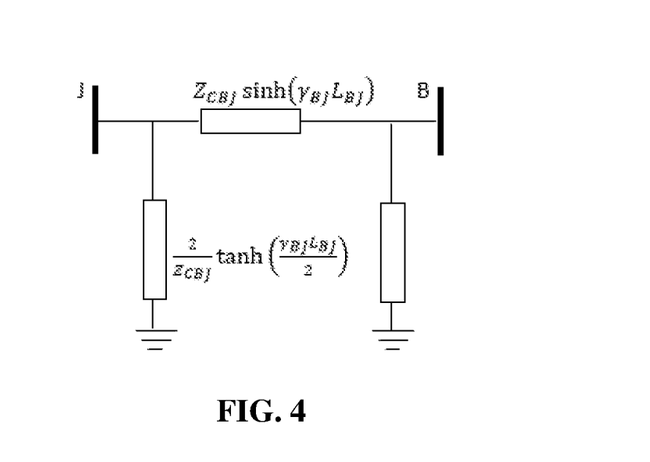
FIG. 4 is an equivalent pi model of a section BJ of the three terminal system.

Considering the distributed parameter model of healthy section BJ, as shown in FIG. 4, the positive-sequence component of the post-fault current at bus B can be obtained by Kirchhoff's voltage law (KVL) and Kirchhoff's current law (KCL) as $$I_B^1 = \frac{V_B^1}{Zc_{BJ}}\tanh(\gamma_{BJ}L_{BJ}*0.5) + \frac{V_B^1 - V_J^1}{Zc_{BJ}*\sinh(\gamma_{BJ}L_{BJ})} \quad (8)$$

where,
$Zc_{BJ}$ is the surge impedance of line BJ, $\gamma_{BJ}$ and $L_{BJ}$ are respectively propagation constant and lengths of the line section BJ, and
$V_B^1$ and $V_J^1$ are post-fault positive sequence voltages at buses B and J.

Referring to equation (6) and substituting in equation (8), and rewriting we get $$I_B^1 = I_B^{1,pre} - A_{BJ}Z_{BF}^{new}(d)I_F - B_{BJ}Z_{JF}^{new}(d)I_F \quad (9)$$

where $I_B^{1,pre}$ is the pre-fault positive sequence current at bus B of line BJ, and $A_{BJ}$ and is $B_{BJ}$ can be calculated as below, $$A_{BJ} = \frac{1}{Zc_{BJ}}\tanh(\gamma_{BJ}L_{BJ}*0.5) + \frac{1}{Zc_{BJ}*\sinh(\gamma_{BJ}L_{BJ})} \quad (10)$$

$$B_{BJ} = \frac{-1}{Zc_{BJ}*\sinh(\gamma_{BJ}L_{BJ})} \quad (11)$$

The pure-fault current, i.e. difference between post- and pre-fault current phasors at bus B corresponding to one of the two healthy sections can therefore be expressed as in (12) as a function of unknown fault distance d, impedances and fault current $I_F$ $$I_B^1 - I_B^{1,pre} = [A_{BJ}Z_{BF}^{new}(d) + B_{BJ}Z_{JF}^{new}(d)]I_F \quad (12)$$

Similarly, pure-fault current, i.e. difference between post- and pre-fault current phasors at bus C can also be written as in (13)

$$I_C^1 - I_C^{1,pre} = [A_{CJ}Z_{CF}^{new}(d) + B_{CJ}Z_{JF}^{new}(d)]I_F \quad (13)$$

Thereafter, fault component of the positive sequence current at bus corresponding to faulted section is calculated.

Figure 5:
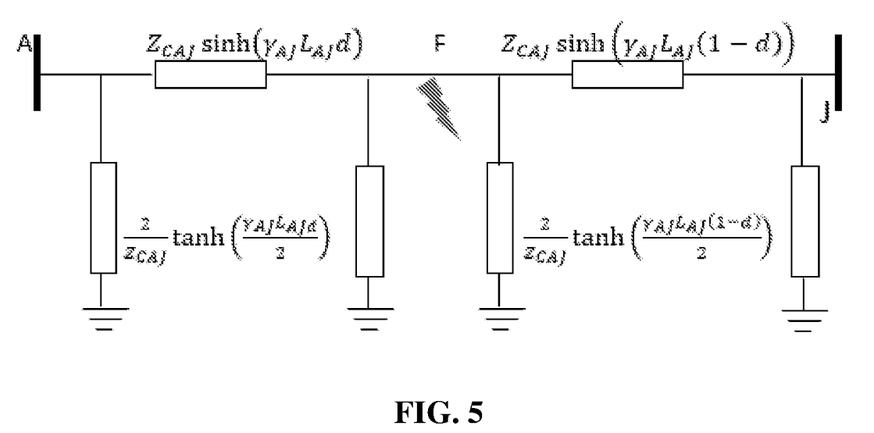
FIG. 5 is an equivalent pi model of a section AJ of the three terminal system with fault at F, dL kilometres from bus A.

FIG. 5 shows section AJ between bus A and junction J with a fault at point F. The fault is at a distance d from the bus A, where d is expressed as a fraction of the total length of the faulted line, $L_{AJ}$ kilometres. Here, the distributed parameter model of the line is depicted by an equivalent pi model.

Assuming fault on section AJ, this step involves calculation of $(I_A^1 - I_A^{1,pre})$ as a function of impedances and unknown fault location (d).

$A_{AJ}$ and $B_{AJ}$ correspondingly for the faulted line cannot be developed by (10) and (11), since the line impedance can no more be considered as a constant. To obtain $A_{AJ}$ and $B_{AJ}$, we remove line AJ from the system and replace it by two current sources. Considering the positive sequence superimposed network for this modified system, the following equations can be formed, $$V_A^1 = V_A^{1,pre} - Z_{AA}^{mod}(I_{AJ}^1 - I_{AJ}^{1,pre}) - Z_{AJ}^{mod}(I_{JA}^1 - I_{JA}^{1,pre}) \quad (14)$$

$$V_J^1 = V_J^{1,pre} - Z_{JA}^{mod}(I_{AJ}^1 - I_{AJ}^{1,pre}) - Z_{JJ}^{mod}(I_{JA}^1 - I_{JA}^{1,pre}) \quad (15)$$

where,
$Z_{AJ}^{mod}$, $Z_{JA}^{mod}$, $Z_{AA}^{mod}$ and $Z_{JJ}^{mod}$ is corresponding elements of the bus-impedance matrix of the reduced network excluding faulted section AJ. This can be simply formed by deleting the terms corresponding to this section in the $Y_{BUS}$ formulation, or from the source impedance matrix with the IED, $V_A^1$, $V_A^{1,pre}$ are post-fault and pre-fault voltages at bus A,
$V_J^1$, $V_J^{1,pre}$ are post-fault and pre-fault voltages at J,
$V_{AJ}^1$ and $V_{AJ}^{1,pre}$ are post-fault and pre-fault currents at bus A, and
$V_{JA}^1$ and $V_{JA}^{1,pre}$ are post-fault and pre-fault currents at J flowing into section AJ.

For faulted section AJ, $$V_A^1 = V_A^{1,pre} - Z_{AF}^{new}*I_F \quad (16)$$

$$V_J^1 = V_J^{1,pre} - Z_{JF}^{new}*I_F \quad (17)$$

Equating equations (14) to (16) and (15) to (17), $$Z_{AA}^{mod}(I_{AJ}^1 - I_{AJ}^{1,pre}) - Z_{AJ}^{mod}(I_{JA}^1 - I_{JA}^{1,pre}) = Z_{AF}^{new}*I_F \quad (18)$$

$$Z_{JA}^{mod}(I_{AJ}^1 - I_{AJ}^{1,pre}) - Z_{JJ}^{mod}(I_{JA}^1 - I_{JA}^{1,pre}) = Z_{JF}^{new}*I_F \quad (19)$$

Now solving for $(I_{JA}^1 - I_{JA}^{1,pre})$ and $(I_{AJ}^1 - I_{AJ}^{1,pre})$ from (18) and (19), we get, $$I_{AJ}^1 - I_{AJ}^{1,pre} = \frac{Z_{JJ}^{mod}Z_{AF}^{new}(d) - Z_{AJ}^{mod}A_{JF}^{new}(d)}{Z_{JJ}^{mod}Z_{AA}^{mod} - Z_{AJ}^{mod2}}I_F \quad (20)$$

$$I_{JA}^1 - I_{JA}^{1,pre} = \frac{Z_{AA}^{mod}Z_{AF}^{new}(d) - Z_{AJ}^{mod}Z_{JF}^{new}(d)}{Z_{JJ}^{mod}Z_{AA}^{mod} - Z_{AJ}^{mod2}}I_F \quad (21)$$

Comparing (20) and (21) with (13), we get $$A_{AJ} = \frac{Z_{JJ}^{mod}}{Z_{AJ}^{mod2} - Z_{JJ}^{mod}Z_{AA}^{mod}}, A_{JA} = \frac{Z_{AA}^{mod}}{Z_{AJ}^{mod2} - Z_{JJ}^{mod}Z_{AA}^{mod}} \quad (22)$$

$$B_{AJ} = B_{JA} = \frac{-Z_{AJ}^{mod}}{Z_{AJ}^{mod2} - Z_{JJ}^{mod}Z_{AA}^{mod}} \quad (23)$$

From equations (20) and (21), the following equation (24) can be written for the faulted section AJ, similar to equation (12)/(13)

$$I_A^1 - I_A^{1,pre} = [A_{AJ}Z_{AF}^{new}(d) + B_{AJ}Z_{JF}^{new}(d)]I_F \quad (24)$$

The quantities estimated above are equated with measured quantities to solve for the fault section identification. Assuming that the fault is on section AJ, rewritten below, for convenience, are equations (12), (13) and (24) derived in previous sections $$I_B^1 - I_B^{1,pre} = [A_{BJ}Z_{BF}^{new}(d) + B_{BJ}Z_{JF}^{new}(d)]I_F \quad (25)$$

$$I_C^1 - I_C^{1,pre} = [A_{CJ}Z_{CF}^{new}(d) + B_{CJ}Z_{JF}^{new}(d)]I_F \quad (26)$$

$$I_A^1 - I_A^{1,pre} = [A_{AJ}Z_{AF}^{new}(d) + B_{AJ}Z_{JF}^{new}(d)]I_F \quad (27)$$

Here, LHS of the above three equations shall be calculated from the current measurements at buses A, B and C. Taking ratios of equations (25) and (27), we get $$\frac{I_B^1 - I_B^{1,pre}}{I_A^1 - I_A^{1,pre}} = \frac{[A_{BJ}Z_{BF}^{new}(d) + B_{BJ}Z_{JF}^{new}(d)]}{[A_{AJ}Z_{AF}^{new}(d) + B_{AJ}Z_{JF}^{new}(d)]} \quad (28)$$

where, $Z_{BF}^{new}(d)$, $Z_{JF}^{new}(d)$, $Z_{AF}^{new}(d)$ and $Z_{JF}^{new}(d)$ can be calculated from equation (7), $A_{BJ}$ and $B_{BJ}$ can be calculated from equations (10) and (11), and $A_{AJ}$ and $B_{AJ}$ can be calculated from equations (22) and (23).

Substituting for terms in equation (28), we get, $$\frac{I_B^1 - I_B^{1,pre}}{I_A^1 - I_A^{1,pre}} = \frac{\begin{array}{c} P*\sinh(\gamma_{AJ}*L_{AJ}*d) + \\ Q*[\sinh(\gamma_{AJ}*L_{AJ})\cosh(\gamma_{AJ}*L_{AJ}*d) - \\ \cosh(\gamma_{AJ}*L_{AJ})\sinh(\gamma_{AJ}(L_{AJ}*d)] \end{array}}{\begin{array}{c} T*[\sinh(\gamma_{AJ}*L_{AJ})\cosh(\gamma_{AJ}*L_{AJ}*d) - \\ \cosh(\gamma_{AJ}*L_{AJ})\sinh(\gamma_{AJ}*L_{AJ}*d)] + \\ S*\sinh(\gamma_{AJ}*L_{AJ}*d) \end{array}} \quad (29)$$

where, $P = A_{BJ}Z_{JB} + B_{BJ}Z_{JJ}^0$; $Q = A_{BJ}Z_{BB} + B_{BJ}Z_{BJ}^0$;

$S = A_{AJ}Z_{JA} + B_{AJ}Z_{JJ}^0$; $T = A_{AJ}Z_{BA} + B_{AJ}Z_{BJ}^0$

This can be used to define fault section index for each section ($K_A$ for AJ, $K_B$ for BJ, $K_C$ for CJ. For a fault on section AJ, referring to equation (29), we know that $$\frac{I_B^1 - I_B^{1,pre}}{I_A^1 - I_A^{1,pre}} = \frac{\begin{array}{c} P*\sinh(\gamma_{AJ}*L_{AJ}*d) + \\ Q*[\sinh(\gamma_{AJ}*L_{AJ})\cosh(\gamma_{AJ}*L_{AJ}*d) - \\ \cosh(\gamma_{AJ}*L_{AJ})\sinh(\gamma_{AJ}(L_{AJ}*d)] \end{array}}{\begin{array}{c} T*[\sinh(\gamma_{AJ}*L_{AJ})\cosh(\gamma_{AJ}*L_{AJ}*d) - \\ \cosh(\gamma_{AJ}*L_{AJ})\sinh(\gamma_{AJ}*L_{AJ}*d)] + \\ S*\sinh(\gamma_{AJ}*L_{AJ}*d) \end{array}} \quad (30)$$

where, $P1 = A_{BJ}Z_{JB}^0 + B_{BJ}Z_{JJ}^0$; $Q1 = A_{BJ}A_{BB}^0 + B_{BJ}Z_{BJ}^0$;

$S1 = A_{AJ}Z_{JA}^0 + B_{AJ}Z_{JJ}^0$; $T1 = A_{AJ}Z_{BA}^0 + B_{AJ}Z_{BJ}^0$ $A_{AJ} = \frac{Z_{JJ}^{mod}}{Z_{AJ}^{mod2} - Z_{JJ}^{mod}Z_{AA}^{mod}}$, $B_{AJ} = \frac{-Z_{AJ}^{mod}}{Z_{AJ}^{mod2} - Z_{JJ}^{mod}Z_{AA}^{mod}}$, $A_{BJ} = \frac{1}{Zc_{BJ}}\tanh(\gamma_{BJ}L_{BJ}*0.5) + \frac{1}{Zc_{BJ}*\sinh(\gamma_{BJ}L_{BJ})}$;

$B_{BJ} = \frac{-1}{Zc_{BJ}*\sinh(\gamma_{BJ}L_{BJ})}$.

In the above, $Z_{nm}^{mod}$ is the corresponding element of the modified bus impedance matrix after simply removing the elements corresponding to the faulted section AJ, $Z_{ij}^0$ is the corresponding element of the original bus impedance matrix, $Zc_{BJ}$ is the surge impedance of line BJ, $\gamma_{BJ}$ and $L_{BJ}$ are respectively propagation constant and lengths if the line BJ, and $Zc_{AJ}$ is the surge impedance of line AJ, $\gamma_{AJ}$ and $L_{AJ}$ are respectively propagation constant and lengths if the line AJ.

Fault section index K can be defined in one way as below in equation (30)

$$K_A = \left[\frac{I_B^1 - I_B^{1,pre}}{I_A^1 - I_A^{1,pre}}\right] - \left[\frac{\begin{array}{c} P1*\sinh(\gamma_{AJ}*L_{AJ}*d) + \\ Q1*[\sinh(\gamma_{AJ}*L_{AJ})\cosh(\gamma_{AJ}*L_{AJ}*d) - \\ \cosh(\gamma_{AJ}*L_{AJ})\sinh(\gamma_{AJ}*L_{AJ}*d)] \end{array}}{\begin{array}{c} T1*[\sinh(\gamma_{AJ}*L_{AJ})\cosh(\gamma_{AJ}*L_{AJ}*d) - \\ \cosh(\gamma_{AJ}*L_{AJ})\sinh(\gamma_{AJ}*L_{AJ}*d)] + \\ S1*\sinh(\gamma_{AJ}*L_{AJ}*d) \end{array}}\right]$$

Figure 6:
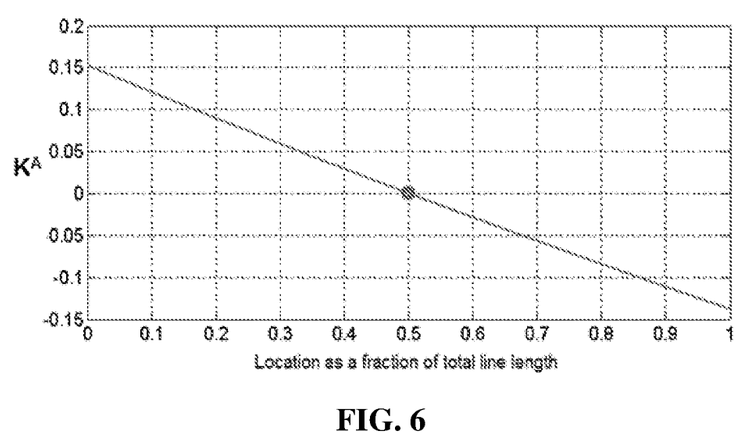
FIG. 6 is a plot of a fault section index ($K_A$) for various fault locations.

It is observed that $K_A$ as calculated using equation (30) is equal to zero when the variable, d, is equal to the unknown fault location expressed as a fraction of length of section AJ. For values of d less than the actual fault location, the value of $K_A$ will be positive. For values of d greater than the actual fault location $K_A$ will be negative, as seen in FIG. 6.

Hence by checking the value of $K_A$ at d=0 and d=1 and comparing their signs, we can identify if there is a fault on section AJ. Let us create a fault in 50% of AJ section. As seen from FIG. 6, if the fault is on section AJ, the value of $K_{A0}$ will be positive and value of $K_{A1}$ will be negative.

$K_{A0}$ is defined as $K_A$ at d=0 and $K_{A1}$ is defined as $K_A$ at d=1. From equation (30), $$K_{A0} = \left|\frac{I_B^1 - I_B^{1,pre}}{I_A^1 - I_A^{1,pre}}\right| - \left|\frac{Q1}{T1}\right|, \text{ and}$$

$$K_{A1} = \left|\frac{I_B^1 - I_B^{1,pre}}{I_A^1 - I_A^{1,pre}}\right| - \left|\frac{P1}{S1}\right|.$$

Similarly, for a fault on section BJ, we get equation (31)

$$K_B = \left[\frac{I_A^1 - I_A^{1,pre}}{I_B^1 - I_B^{1,pre}}\right] - \left[\frac{\begin{array}{c} P2*\sinh(\gamma_{BJ}*L_{BJ}*d) + \\ Q2*[\sinh(\gamma_{BJ}*L_{BJ})\cosh(\gamma_{BJ}*L_{BJ}*d) - \\ \cosh(\gamma_{BJ}*L_{BJ})\sinh(\gamma_{BJ}*L_{BJ}*d)] \end{array}}{\begin{array}{c} T2*[\sinh(\gamma_{BJ}*L_{BJ})\cosh(\gamma_{BJ}*L_{BJ}*d) - \\ \cosh(\gamma_{BJ}*L_{BJ})\sinh(\gamma_{BJ}*L_{BJ}*d)] + \\ S2*\sinh(\gamma_{BJ}*L_{BJ}*d) \end{array}}\right]$$

where, $P2 = A_{BJ}Z_{JB}^0 + B_{BJ}Z_{JJ}^0$; $Q2 = A_{BJ}Z_{BB}^0 + B_{BJ}Z_{BJ}^0$;

$S2 = A_{AJ}Z_{JA}^0 + B_{AJ}Z_{JJ}^0$; $T2 = A_{AJ}Z_{BA}^0 + B_{AJ}Z_{BJ}^0$;

$Z_{JB}^0$, $Z_{JJ}^0$, $Z_{BB}^0$, $Z_{BJ}^0$, $Z_{JA}^0$ and $Z_{BA}^0$ are the corresponding elements of the original bus impedance matrix $$A_{BJ} = \frac{Z_{JJ}^{mod}}{Z_{BJ}^{mod2} - Z_{JJ}^{mod}Z_{BB}^{mod}}, B_{BJ} = \frac{-Z_{BJ}^{mod}}{Z_{BJ}^{mod2} - Z_{JJ}^{mod}Z_{BB}^{mod}}$$

In the above, $Z_{BJ}^{mod}$, $Z_{JB}^{mod}$, $Z_{BB}^{mod}$ and $Z_{JJ}^{mod}$ is corresponding elements of the bus-impedance matrix of the reduced network excluding faulted section BJ. This can be simply formed by deleting the terms corresponding to this section in the $Y_{BUS}$ formulation.

$$A_{AJ} = \frac{1}{Zc_{AJ}}\tanh(\gamma_{AJ}L_{AJ}*0.5) + \frac{1}{Zc_{AJ}*\sinh(\gamma_{AJ}L_{AJ})};$$

-continued $$B_{AJ} = \frac{-1}{Zc_{AJ} * \sinh(\gamma_{AJ} L_{AJ})}$$

$Zc_{BJ}$ is the surge impedance of line BJ, $\gamma_{BJ}$ and $L_{BJ}$ are respectively propagation constant and lengths if the line BJ, and $Zc_{AJ}$ is the surge impedance of line AJ, $\gamma_{AJ}$ and $L_{AJ}$ are respectively propagation constant and lengths if the line AJ.

By checking the value of $K_B$ at d=0 and d=1 and comparing their signs, we can identify if there is a fault on section BJ. If the fault is on section BJ, the value of $K_{B0}$ will be positive and value of $K_{B1}$ will be negative.

$K_{B0}$ is defined as $K_B$ at d=0 and $K_{B1}$ is defined as $K_B$ at d=1.

From equation (31), $$K_{B0} = \left|\frac{I_A^1 - I_A^{1,pre}}{I_B^1 - I_B^{1,pre}}\right| - \left|\frac{Q2}{T2}\right| \text{ and } K_{B1} = \left|\frac{I_A^1 - I_A^{1,pre}}{I_B^1 - I_B^{1,pre}}\right| - \left|\frac{P2}{S2}\right|$$

Similarly, for a fault on section CJ, we have equation (32), $$K_C = \left[\frac{I_A^1 - I_A^{1,pre}}{I_C^1 - I_C^{1,pre}}\right] - \begin{bmatrix} P3*\sinh(\gamma_{CJ}*L_{CJ}*d) + \\ Q3*[\sinh(\gamma_{CJ}*L_{CJ})\cosh(\gamma_{CJ}*L_{CJ}*d) - \\ \cosh(\gamma_{CJ}*L_{CJ})\sinh(\gamma_{CJ}*L_{CJ}*d)] \\ T3*[\sinh(\gamma_{CJ}*L_{CJ})\cosh(\gamma_{CJ}*L_{CJ}*d) - \\ \cosh(\gamma_{CJ}*L_{CJ})\sinh(\gamma_{CJ}*L_{CJ}*d)] + \\ S3*\sinh(\gamma_{CJ}*L_{CJ}*d) \end{bmatrix}$$

where, $P3 = A_{CJ}Z_{JC}^0 + B_{CJ}Z_{JJ}^0; Q3 = A_{CJ}Z_{CC}^0 + B_{CJ}Z_{CJ}^0;$ $S3 = A_{AJ}Z_{JA}^0 + B_{AJ}Z_{JJ}^0; T3 = A_{AJ}Z_{CA}^0 + B_{AJ}Z_{CJ}^0;$ $Z_{JC}^0, Z_{JJ}^0, Z_{CC}^0, Z_{CJ}^0, Z_{JA}^0$ and $Z_{CA}^0$ are the corresponding elements of the original bus impedance matrix $$A_{CJ} = \frac{Z_{JJ}^{mod}}{Z_{CJ}^{mod^2} - Z_{JJ}^{mod}Z_{CC}^{mod}}, B_{CJ} = \frac{-Z_{CJ}^{mod}}{Z_{CJ}^{mod^2} - Z_{JJ}^{mod}Z_{CC}^{mod}}$$

$Z_{CJ}^{mod}, Z_{JC}^{mod}, Z_{CC}^{mod}$ and $Z_{JJ}^{mod}$ is corresponding elements of the bus-impedance matrix of the reduced network excluding faulted section CJ. This can be simply formed by deleting the terms corresponding to this section in the $Y_{BUS}$ formulation.

$$A_{AJ} = \frac{1}{Zc_{AJ}}\tanh(\gamma_{AJ} L_{AJ}*0.5) + \frac{1}{Zc_{AJ}*\sinh(\gamma_{AJ} L_{AJ})};$$

$$B_{AJ} = \frac{-1}{Zc_{AJ}*\sinh(\gamma_{AJ} L_{AJ})}$$

$Zc_{CJ}$ is the surge impedance of line CJ, $\gamma_{CJ}$ and $L_{CJ}$ are respectively propagation constant and lengths if the line CJ, and $ZC_{AJ}$ is the surge impedance of line AJ, $\gamma_{AJ}$ and $L_{AJ}$ are respectively propagation constant and lengths if the line AJ.

$K_{C0}$ is defined as $K_C$ at d=0 and $K_{C1}$ is defined as $K_C$ at d=1.

From equation (32), $$K_{C0} = \left|\frac{I_A^1 - I_A^{1,pre}}{I_C^1 - I_C^{1,pre}}\right| - \left|\frac{Q3}{T3}\right| \text{ and } K_{C1} = \left|\frac{I_A^1 - I_A^{1,pre}}{I_C^1 - I_C^{1,pre}}\right| - \left|\frac{P3}{S3}\right|$$

By checking the value of $K_C$ at d=0 and d=1 and comparing their signs, we can identify if there is a fault on section CJ. If the fault is on section CJ, the value of $K_{C0}$ will be positive and value of $K_{C1}$ will be negative Thus, for the faulted section can be identified as follows
  Calculate constants P1, Q1, S1 and T1 as given in previous step Calculate $K_{A0} = \left|\frac{I_B^1 - I_B^{1,pre}}{I_A^1 - I_A^{1,pre}}\right| - \left|\frac{Q1}{T1}\right|$ and $K_{A1} = \left|\frac{I_B^1 - I_B^{1,pre}}{I_A^1 - I_A^{1,pre}}\right| - \left|\frac{P1}{S1}\right|$ Calculate constants P2, Q2, S2 and T2 as given in previous step Calculate $K_{B0} = \left|\frac{I_A^1 - I_A^{1,pre}}{I_B^1 - I_B^{1,pre}}\right| - \left|\frac{Q2}{T2}\right|$ and $K_{B1} = \left|\frac{I_A^1 - I_A^{1,pre}}{I_B^1 - I_B^{1,pre}}\right| - \left|\frac{P2}{S2}\right|$ Calculate constants P3, Q3, S3 and T3 as given in previous step Calculate $K_{C0} = \left|\frac{I_A^1 - I_A^{1,pre}}{I_C^1 - I_C^{1,pre}}\right| - \left|\frac{Q3}{T3}\right|$ and $K_{C1} = \left|\frac{I_A^1 - I_A^{1,pre}}{I_C^1 - I_C^{1,pre}}\right| - \left|\frac{P3}{S3}\right|$ Compare the value of K for each section, and identify the faulted section as follows:
  If $K_{A0}$ and $K_{A1}$ are of the opposite sign, the fault is on section AJ
  If $K_{B0}$ and $K_{B1}$ are of the opposite sign, the fault is on section BJ
  If $K_{C0}$ and $K_{C1}$ are of the opposite sign, the fault is on section CJ Thus, by calculating the fault section index K as shown, the faulted section can be identified. The fault section index may be calculated differently by having different assumptions and different assumed values for d.

The fault location can be identified by having different values calculated for K. For example, by varying the value of d, different values of K can be calculated for a section. The value of 'd' for which K is close to a threshold (in the above case '0') is determined the fault location.

The identified section comprising the fault can also be considered as an input to calculate the location of fault in the identified section.

The equation (28) can also be written as follows:

$$\frac{I_B^1 - I_B^{1,pre}}{I_A^1 - I_A^{1,pre}} = \frac{P1*\sinh(\gamma_{AJ}*L_{AJ}*d) + Q1*\sinh(\gamma_{AJ}*L_{AJ}*(1-d))}{S1*\sinh(\gamma_{AJ}*L_{AJ}*d) + T1*\sinh(\gamma_{AJ}*L_{AJ}*(1-d))} \quad (33)$$

The unknown value of (d) can be solved as follows:

$$d = \frac{1}{\gamma_{AJ} * L_{AJ}} \tanh^{-1} \frac{K2}{K1} \quad (34)$$

where $K1 =$ $R1 * S1 - R1 * T1 \cosh(\gamma_{AJ} * L_{AJ}) - P1 + Q1 \cosh(\gamma_{AJ} * L_{AJ})$ $K2 = Q1 * \sinh(\gamma_{AJ} * L_{AJ}) - R1 * T1 \sinh(\gamma_{AJ} * L_{AJ})$ $$R1 = \frac{I_B^1 - I_B^{1,pre}}{I_A^1 - I_A^{1,pre}}$$

The value of (d) can also be obtained by considering any healthy section and a faulted section in the multi-terminal transmission line system. Thus, the location of the fault in the faulted section can be identified using only current measurements, line parameters and source impedances.

Figure 7:
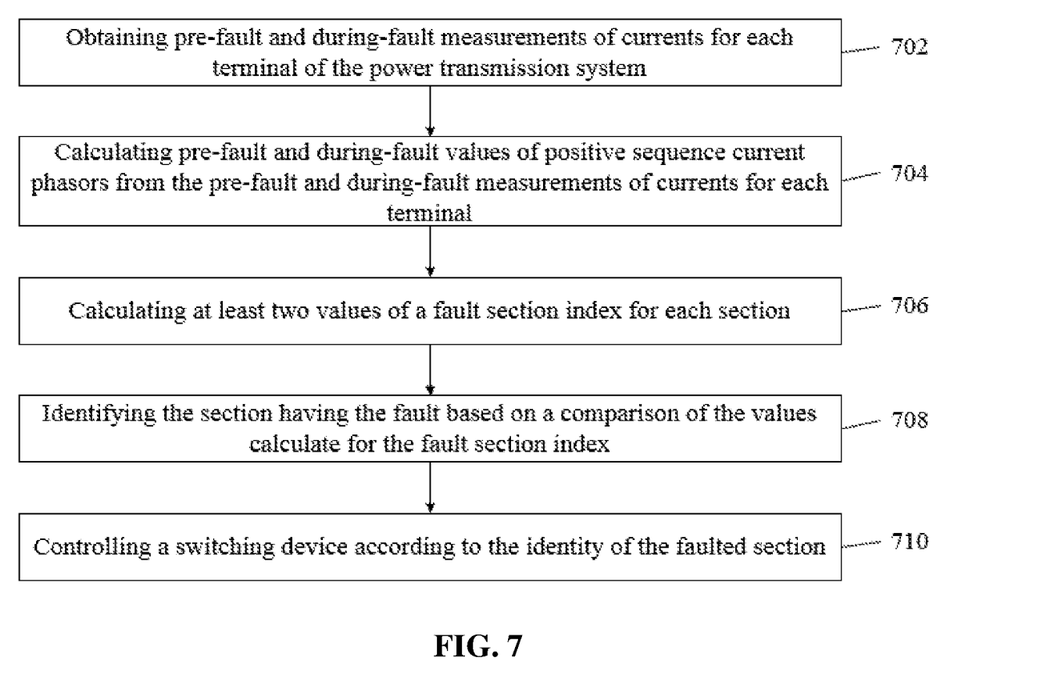
FIG. 7 is a flowchart of a method for protection in response to a fault, in accordance with various embodiments of the present invention.

The method for protection based on the fault section identification is shown in flow chart of FIG. 7.

As shown, at 702, the method includes obtaining pre-fault and during-fault measurements of currents for each terminal of the power transmission system.

The method further includes at 704, calculating pre-fault and during-fault values of positive sequence current phasors from the pre-fault and during-fault measurements of currents for each terminal. The IED can calculate current phasors (e.g. using suitable phasor calculation such as Fourier calculations etc.), from the current measurements. Positive sequence quantities can be derived by using methods such as symmetrical component analysis etc.

At 706, the method includes calculating at least two values of a fault section index for each section. For example, two values for a fault section index can be calculated for one section. For example, for section AJ, fault section index ($K_{AJ0}$, $K_{AJ1}$) can be calculated as explained above, and similarly for BJ and CJ.

The values calculated for the fault section index for each section are used for identifying the section having the fault. The section having the fault is identified based on a comparison of the values of the fault section index estimated for each section at 708. For example, values of $K_{AJ0}$, and $K_{AJ1}$ are compared for section AJ, similarly values computed for section BJ are compared, and so forth. A criteria can be used for identifying the section with the fault. For example, when the two values (in case two values are computed) are of different signs (opposite polarity), then the corresponding section is determined to have the fault.

Several values for the fault section index can be calculated for determining a fault location. The plurality of values for the fault section index are compared with a threshold. The value which is closest to the threshold (e.g. less than or equal to the threshold) is considered to determine the fault location. The fault location corresponds the assumed value of the fault location, where the value for the fault section index is less than the threshold. Thus, this assumed value of fault location is selected as the fault location. This can happen subsequent to auto-reclosing.

The identity of the fault section (i.e. it being an overhead line section or a cable) is used for controlling a switching device according to the identification at 710. Here, auto-reclose is enabled based on the section being an overhead line section. Thus, a circuit breaker associated with an overhead line section can close again if it is decided that the fault is in the overhead line. The IED (processor) can generate a signal for auto-reclosing with the circuit breaker accordingly.

Thus, the IED at a terminal can receive the various current measurements and perform the various steps of the method to determine the faulted section (section having the fault). The IED further controls a switching device such as a circuit breaker to enable auto-reclose only for overhead line section faults. Additionally the fault location is calculated using only current measurements.

Thus, the present invention provides a method and device for estimating fault section and location in a multi-terminal transmission line system using only current measurements. Also, line parameters and source impedances are required, where source impedances can be calculated if not available.

The proposed method is non-iterative and the accuracy of the method is not affected by fault resistance, fault loop information, loading conditions, mutual coupling and line configuration.

The invention claimed is:

1. A method of protection in response to a fault in a multi-terminal power transmission system that comprises a first transmission line section connecting a first terminal to a transmission line junction, a second transmission line section connecting a second terminal to the transmission line junction and a third transmission line section connecting a third terminal to the transmission line junction, the fault being located in one of the first, second or third transmission line sections, the method comprising:
    obtaining pre-fault and during-fault measurements of currents for each terminal of the multi-terminal power transmission system;
    calculating pre-fault and during-fault values of positive sequence current phasors from the pre-fault and during-fault measurements of currents for each terminal;
    calculating at least two values of a fault section index for each section, wherein each value of the fault section index for a section is calculated based on
        an assumed value for fault location,
        a difference between the pre-fault and the during-fault values of the positive sequence current phasors for two of the terminals, wherein the two of the terminals include the terminal that the section is connected at and one of the other terminals,
        a length of the section,
        source impedances of the two of the terminals, and
        line parameters of the corresponding section;
    wherein each value of the fault section index for a section calculated is not based on voltage measurements or voltage phasors;
    identifying the section having the fault based on a comparison of the values of the fault section index estimated for each section; and
    controlling a switching device according to the identification of the section having the fault.

2. The method as claimed in claim 1, wherein each section is an overhead line section or a cable.

3. The method as claimed in claim 1, wherein the section having the fault is an overhead line section.

4. The method as claimed in claim 3, further comprising enabling an auto-reclose.

5. The method as claimed in claim 1, wherein identifying the section having the fault comprises calculating a location of the fault by:
    calculating a plurality of values for the fault section index based on a plurality of assumed values for the fault location;
    comparing the plurality of values for the fault section index with a threshold; and selecting the assumed value of the fault location as the location of the fault, where the value for the fault section index is less than the threshold.

6. The method as claimed in claim 1, wherein the source impedance for each terminal is calculated based on a status of one or more circuit breakers connected at the terminal.

7. The method as claimed in claim 6, wherein the status of the circuit breakers is determined from a communication signal.

8. The method as claimed in claim 7, wherein an admittance value of a circuit element connected through each circuit breaker is considered based on the status of the circuit breaker.

9. The method as claimed in claim 1, wherein each value of the fault section index for a section is calculated based only on
the assumed value for fault location,
the difference between the pre-fault and the during-fault values of the positive sequence current phasors for two of the terminals, wherein the two of the terminals include the terminal that the section is connected at and one of the other terminals,
the length of the section,
the source impedances of the two of the terminals, and
the line parameters of the corresponding section;
wherein each value of the fault section index for the section calculated is not based on voltage measurements or voltage phasors.

10. An Intelligent Electronic Device (IED) configured for protection in response to a fault in a transmission line section of a multi-terminal power transmission system that comprises a first transmission line section connecting a first terminal to a transmission line junction, a second transmission line section connecting a second terminal to the transmission line junction and a third transmission line section connecting a third terminal to the transmission line junction, the IED comprising:
an interface configured to obtain pre-fault and during-fault measurements of currents for each terminal of the multi-terminal power transmission system;
a processor; and
a memory storing instructions that, when executed by the processor, cause the processor to:
calculate pre-fault and during-fault values of positive sequence current phasors from the pre-fault and during-fault measurements of currents for each terminal;
calculate at least two values of a fault section index for each section, wherein each value of the fault section index for a section is calculated based on:
an assumed value for fault location;
a difference between the pre-fault and the during-fault values of the positive sequence current phasors for two terminals of the power transmission system, wherein the two terminals include the terminal that the section is connected at and one of the other terminals of the multi-terminal power transmission system;
a length of the section;
source impedances of the two terminals; and
line parameters of the corresponding section;
wherein each value of the fault section index for a section calculated is not based on voltage measurements or voltage phasors;
identify the section having the fault based on a comparison of the values of the fault section index estimated for each section; and
generate a signal to control a switching device according to the identification of the section having the fault, wherein auto-reclose is enabled when the section is an overhead line section.

11. The TED as claimed in claim 10, wherein instructions cause the processor to identify the section having the fault by calculating a location of the fault.

12. The TED as claimed in claim 11, wherein calculating the location of the fault comprises:
calculating a plurality of values for the fault section index based on a plurality of assumed values for the fault location;
comparing the plurality of values for the fault section index with a threshold; and
selecting the assumed value of the fault location as the location of the fault, where the value for the fault section index is less than the threshold.

13. The TED as claimed in claim 10, wherein the processor is configured to calculate the source impedance for each terminal based on a status of one or more circuit breakers connected at the terminal.

14. The TED as claimed in claim 13, wherein the status of the circuit breakers is determined from a communication signal.

15. The TED as claimed in claim 14, wherein an admittance value of a circuit element connected through each circuit breaker is considered based on the status of the circuit breaker.

16. A system comprising:
a first terminal;
a second terminal;
a third terminal;
a first transmission line section connecting the first terminal to a transmission line junction;
a second transmission line section connecting the second terminal to the transmission line junction;
a third transmission line section connecting the third terminal to the transmission line junction; and
an Intelligent Electronic Device (IED) associated with one of the first, second and third terminals and configured to:
obtain pre-fault and during-fault measurements of currents for each terminal;
calculate pre-fault and during-fault values of positive sequence current phasors from the pre-fault and during-fault measurements of currents for each terminal;
calculate a plurality of values of a fault section index for each section, wherein each value of the fault section index for a section is calculated based on
an assumed value for fault location,
a difference between the pre-fault and the during-fault values of the positive sequence current phasors for two of the terminals, wherein the two of the terminals include the terminal that the section is connected at and one of the other terminals,
a length of the section,
source impedances of the two of the terminals, and
line parameters of the corresponding section;
wherein each value of the fault section index for a section calculated is not based on voltage measurements or voltage phasors;
identify the section having the fault based on a comparison of the values of the fault section index estimated for each section; and
control a switching device according to the identification of the section having the fault.

17. The system as claimed in claim 16, wherein each transmission line section is an overhead line section or a cable.

18. The system as claimed in claim 17, wherein auto-reclose is enabled when the section is an overhead line section.

19. The system as claimed in claim 16, wherein the IED is configured to identify the section having the fault by determining a location of the fault by:
- calculating a plurality of values for the fault section index based on a plurality of assumed values for the fault location;
- comparing the plurality of values for the fault section index with a threshold; and
- selecting the assumed value of the fault location as the location of the fault, wherein the value for the fault section index is less than the threshold.

20. The system as claimed in claim 16, wherein the source impedance for each terminal is calculated based on a status of one or more circuit breakers connected at the terminal.

21. The system as claimed in claim 20, wherein of the circuit breakers is determined from a communication signal.

22. The system as claimed in claim 21, wherein an admittance value of a circuit element connected through each circuit breaker is considered based on the status of the circuit breaker.

* * * * *

UNITED STATES PATENT AND TRADEMARK OFFICE
CERTIFICATE OF CORRECTION

PATENT NO. : 12,021,374 B2
APPLICATION NO. : 17/044188
DATED : June 25, 2024
INVENTOR(S) : Obbalareddi Demudu Naidu, Neethu George and Swaroop Gajare It is certified that error appears in the above-identified patent and that said Letters Patent is hereby corrected as shown below:

In the Claims

In Column 18, Line 5, Claim 11:
Change "The TED as claimed in claim 10,"
To --The IED as claimed in claim 10,--

In Column 18, Line 8, Claim 12:
Change "The TED as claimed in claim 11,"
To --The IED as claimed in claim 11,--

In Column 18, Line 18, Claim 13:
Change "The TED as claimed in claim 10,"
To --The IED as claimed in claim 10,--

In Column 18, Line 22, Claim 14:
Change "The TED as claimed in claim 13,"
To --The IED as claimed in claim 13,--

In Column 18, Line 25, Claim 15:
Change "The TED as claimed in claim 14,"
To --The IED as claimed in claim 14,--

Signed and Sealed this
Thirtieth Day of July, 2024

Katherine Kelly Vidal
*Director of the United States Patent and Trademark Office*